United States Patent [19]

Telefus

[11] Patent Number: 4,870,298
[45] Date of Patent: Sep. 26, 1989

[54] POWER SWITCH BOOSTER CIRCUIT

[76] Inventor: Mark Telefus, 2518 14th Ave., San Francisco, Calif. 94127

[21] Appl. No.: 185,073

[22] Filed: Apr. 22, 1988

[51] Int. Cl.⁴ .................... H03K 17/56; H03K 17/60; H03K 3/26
[52] U.S. Cl. .................................. 307/264; 307/260; 307/643; 307/247.1; 363/89; 363/101
[58] Field of Search ............... 307/264, 260, 270, 254, 307/570, 571, 247.1, 633, 639, 643, 71; 363/86, 89, 101; 323/287, 351

[56] References Cited

U.S. PATENT DOCUMENTS

| | | | |
|---|---|---|---|
| 3,174,055 | 3/1965 | Clapper | 307/268 |
| 3,610,961 | 10/1971 | Hewlett, Jr. | 307/643 |
| 3,881,118 | 4/1975 | Forrest et al. | 307/643 |
| 3,935,482 | 1/1976 | Fox, Jr. et al. | 307/639 |
| 4,118,768 | 10/1978 | Wilson et al. | 307/643 |
| 4,243,940 | 1/1981 | Ruof | 307/264 |
| 4,360,744 | 11/1982 | Taylor | 307/254 |
| 4,433,251 | 2/1984 | Banks et al. | 307/639 |
| 4,441,068 | 4/1984 | Smith | 307/351 |

OTHER PUBLICATIONS

Ed Woodward, "This circuit switches ac loads the clean way", EDN, Nov. 20, 1975, pp. 60–62.
John Markus, "Telephone Circuits", Modern Electronic Circuits Reference Manual, McGraw-Hill, 1980, p. 997.

*Primary Examiner*—Stanley D. Miller
*Assistant Examiner*—Nancy Thai
*Attorney, Agent, or Firm*—Blakely, Sokoloff, Taylor & Zafman

[57] ABSTRACT

A power booster circuit is described. The booster circuit having amplifying circuitry comprises an input circuit, a switching circuit, and an auxiliary power circuit. The booster circuit is initiated by receipt of a signal by the input circuit. The amplifying circuit latches on when initiated by the switching circuit. The amplifying circuit produces a constant boosted power signal, using an auxiliary power circuit.

7 Claims, 2 Drawing Sheets

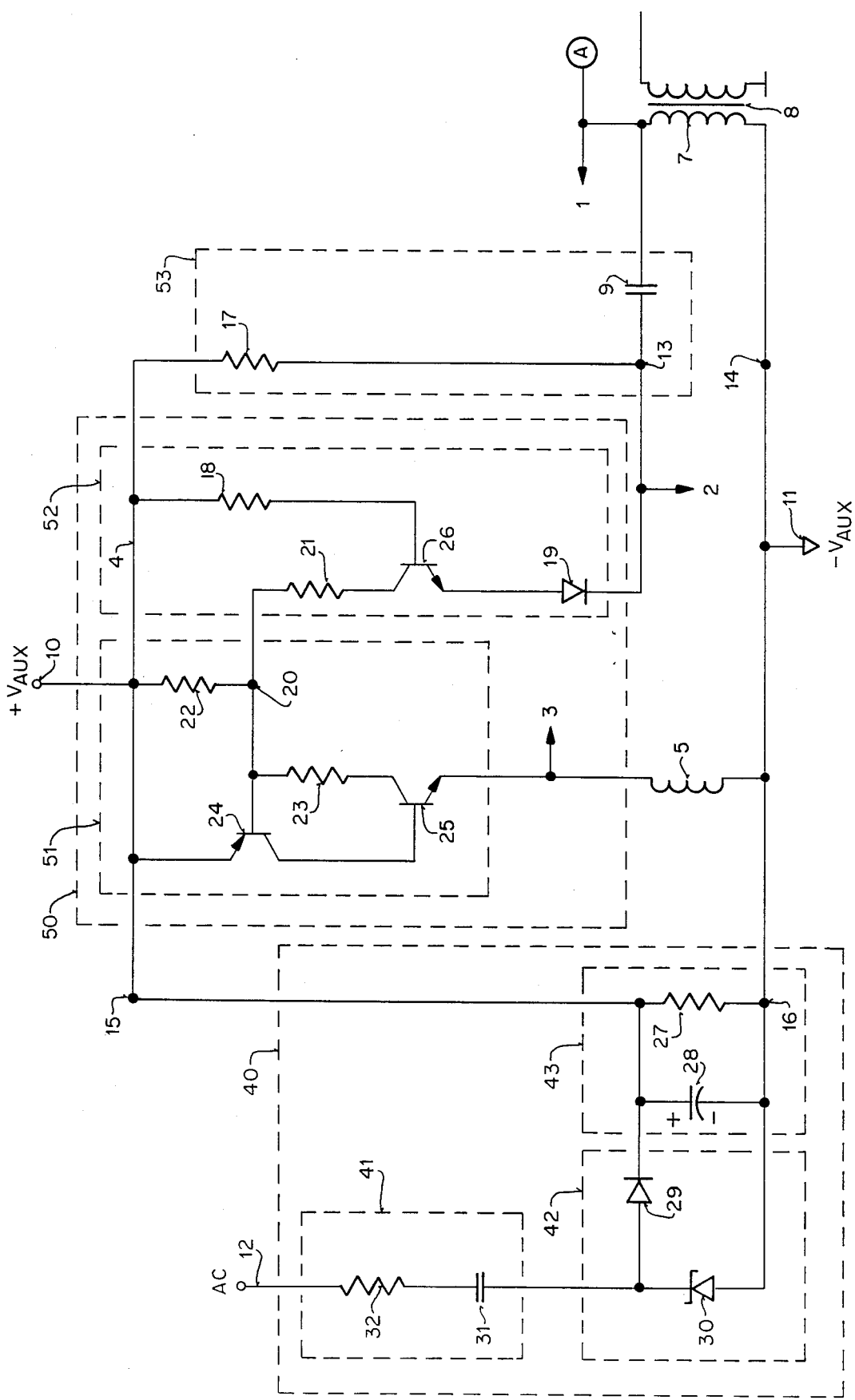
FIG_1

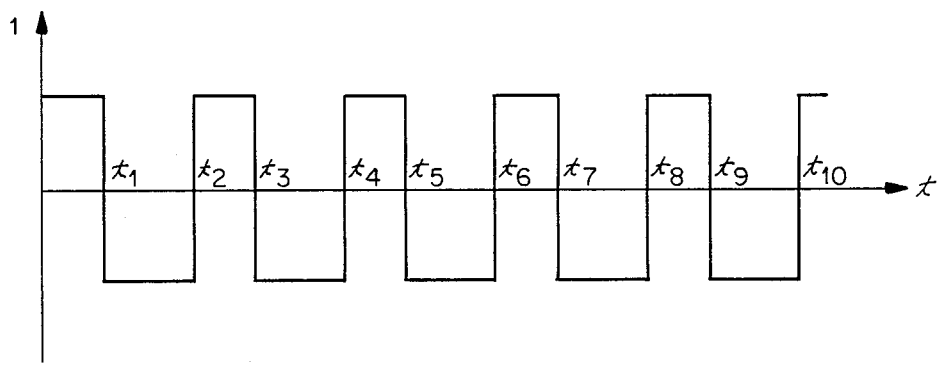
FIG_2
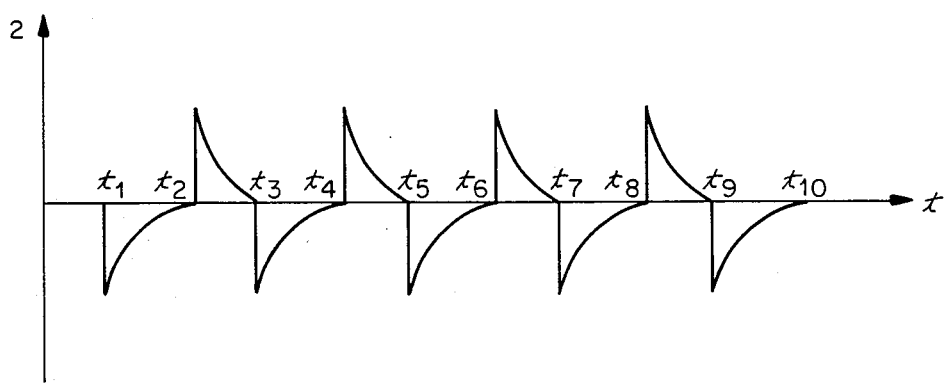
FIG_3
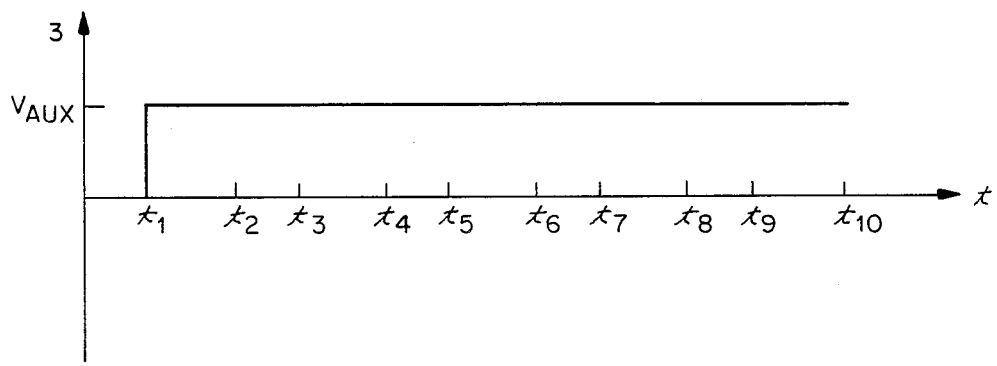
FIG_4

POWER SWITCH BOOSTER CIRCUIT

BACKGROUND OF THE INVENTION

1. Field of the Invention

The present invention relates to the field of power boost circuitry for power supplies and, more particularly, to power boost circuits utilized in switching mode power supplies.

2. Prior Art

A number of power boost circuits are known in the applicable art. However, the present invention teaches a number of inventive advantages over such known circuits. Generally, it is an object of the present invention to provide a power boost circuit providing high speed and gain requiring minimal input power. It is a second object of the present invention to provide such a power boost circuit utilizing latching circuitry.

One such power boosting device is described in an article by E. Woodward entitled "Circuit switch AC load: the clean way, "*EDN*, p. 160-2, Nov. 20, 1975. The circuit described is slow to turn on. The time required to turn on the circuit is based on the constant:

$$\tau = R_2 \times C_2$$

Where R2 is a resistor and C2 is a capacitor. Capacitor C2 is a large capacitor, so the speed is correspondingly slow. Because the size of resistor R2 is fixed, the turn on speed of the "Darlington" is fully dependent on the value of capacitor C2, where the input current equals $C_2 \times (dv/dt)$. Besides the poor speed performance, this circuit cannot provide a permanent latch. The latching time is limited, where R1 is a resistor and C1 is a capacitor, to the constant:

$$\tau = 6 \times R_1 \times C_1$$

Another booster circuit is described in note #120 of *TRW Power Semiconductor* by D. Roarke. This circuit had a capacitor coupled drive for the switching transistor. Control of the "Darlington" powder switch is provided by grounding the base of the transistor, or by supplying high input level of current. The speed of this circuit is limited by the speed of two transistors. Additionally this circuit is incapable of latching.

Another boosting circuit is described in U.S. Pat. No. 4,360,744 (Taylor), entitled "Semiconductor switching circuits". The Taylor semiconductor switching circuits are based on a cascaded connection. The cascaded connection has a low voltage, high current, high speed switching device connected in series with a high voltage, low speed transistor. The switching control of the Taylor circuit is that of a transistor which requires additional circuitry. This additional circuitry severely increases both the complication and expense of the circuit. Additionally, the Taylor circuit is limited in application.

The prior art circuitry depends on the switching speed of at least one transistor. Given this limitation, a circuit with a switching device that comprises a lesser number of current barriers will have an inherent speed advantage. What is needed is a high speed, high gain power booster circuit that is both capable of latching and requires relatively little initial driving power. One object of the present invention is to provide for such a circuit.

SUMMARY OF THE INVENTION

A circuit for providing continuous power boost given a minimal input power signal is described. The circuit of the present invention has particular application in switching mode power supplies.

The power boost circuit of the present invention comprises an auxiliary power means for supplying power.

The booster circuit switching circuitry comprises a transistor latch circuit and emitter driven transistor. Auxiliary power is provided by an AC source that is coupled to a rectification and voltage regulation circuit. The rectification and voltage regulation circuit passes the power through a filter to the latch circuit. The latch circuit has an amplifier that switches on upon receipt of a signal from input circuitry. The input circuitry comprises a source of pulses and a differential network. A signal from the pulse source activates the latch circuit by passing through the differential network to a switching diode. When conducting, the switching diode latches the amplifying circuitry.

DESCRIPTION OF THE DRAWINGS

FIG. 1 is a circuit diagram of the power booster circuit of the present invention.

FIG. 2 is a timing diagram of the voltage appearing at node 1 of the circuit of FIG. 1.

FIG. 3 is a timing diagram of the voltage appearing at node 2 of the circuit of FIG. 1.

FIG. 4 is a timing diagram of the voltage appearing at node 3 of the circuit of FIG. 1.

DETAILED DESCRIPTION OF THE INVENTION

The present invention describes a power booster circuit. In the following description, numerous specific details are set forth in order to provide a thorough understanding of the present invention. It will be obvious, however, to one skilled in the art that the present invention may be practiced without these specific details. In other instances, well-known methods and structures have not been described in detail so as not to unnecessarily obscure the present invention.

The invention was developed for a start-up circuit of a switching mode power supply, as described in applicant's co-pending U.S. patent application entitled "Start-up circuit for switching mode power supply," Ser. No. 07/152,680, filed on Feb. 5, 1988. In the operation of the start-up circuit, first the initiation of a train of pulses from a pulse generator occurs. Then the train pulses from the pulse generator activate a latching circuit to connect the bulk power to the main transformer. Lastly, the pulses disengage the initial start-up circuitry. The latches that connect the bulk power source and disconnect the starting circuitry are devices such as power or solid state relays. These relays cannot be activated by the low impedance, low power level train pulses. In order to activate these devices, the train pulses must be boosted by a power boosting circuit such as the one of the present invention.

Although developed for use in a start-up circuit, it will be obvious to those skilled in the art that the present invention is not limited to that application. The present invention can be used in a variety of applications, and is most useful where a high gain, fast switching power booster circuit is needed.

FIG. 1 is a circuit diagram of the power boost circuit of the present invention. An auxiliary power circuit 40 is coupled to terminals 15 and 16. Also coupled to terminal 15 is a latching amplifier circuit 50, which is in turn coupled to terminal 13. The latching amplifier circuit is coupled to a load 5, which is in turn coupled to terminals 14 and 16. Additionally, terminals 13 and 14 are coupled to the pulse input section of the circuit.

The auxiliary power circuit 40 comprises an alternating current (AC) coupling 41, a rectifier 42, and a filter 43. The AC coupling 41 comprises a resistor 32 and a capacitor 31. Resistor 32 is coupled between an AC power source 12 and capacitor 31. Capacitor 31 is coupled between resistor 32 and rectifier 42. The rectifier 42 comprises diode 29 and zener diode 30. Diode 29 is a rectifier diode, while zener diode 30 both rectifies and regulates the voltage of the auxiliary power circuit 40. The rectifier 42 circuit provides a positive terminal power source +Vaux 10, coupled to diode 29, and a terminal ground −Vaux 11, coupled to zener diode 30. A filter 43 is positioned between rectifier 42 and auxiliary power terminals +Vaux 10 and −Vaux 11. The filter 43 comprises capacitor 28 and resistor 27 coupled in parallel between the terminals 15 and 16.

The latching amplifier circuit 50 comprises a latching booster circuit 51 and a turn on circuit 52. The latching booster circuit 51 comprises transistors 24 and 25 with resistors 22 and 23. Transistors 23 has an emitter coupled to +Vaux 10, a base coupled to latching terminal 20, and a collector coupled to the base of transistor 25. Transistor 25 has a collector coupled to resistor 23, a base coupled to the collector of transistor 24, and an emitter coupled to load 5. Resistor 22 is coupled between +Vaux 10 and latching terminal 20. Resistor 23 is coupled between latching terminal 20 and the collector of transistor 25. The turn on circuit 52 comprises transistor 26, diode 19, and resistors 21 and 18. Transistor 26 has a collector coupled to resistor 21, a base coupled to resistor 18, and an emitter coupled to diode 19. The diode 19 is coupled between the emitter of transistor 26 and pulse terminal 13. Resistor 21 is coupled between the collector of transistor 26 and the latching terminal 20. Resistor 18 is coupled between +Vaux 10 and the base of transistor 26.

The input section of the circuit comprises a differentiation network 53 and a pulse receiving device. The differentiation network 53 comprises capacitor 9 and resistor 17. Capacitor 9 is coupled between pulse terminal 13 and the pulse receiving device. Resistor 17 is coupled between the pulse terminal 13 and +Vaux 10. The pulse receiving device, in the preferred embodiment, is a seecondary coil 7 of transformer 8. The secondary coil 7 of transformer 8 is coupled between capacitor 9 and −Vaux 11. Node A, coupled to secondary coil 7 of transformer 8, is the ultimate destination of the pulses. In the preferred embodiment, node A is a switching transistor of a switching mode power supply.

The turn-off portion of the drive pulses emanates from secondary coil 7 of transformer 8 via resistor 17 and capacitor 9. Resistor 17 and capacitor form a differentiation network to develop a series of negative and positive spikes with a maximum amplitude equal to the driving pulse's amplitude. When the first pulse changes from positive to negative, capacitor 9 is too large to charge-up. This causes all negative spikes to apply to the cathode of diode 19, which in turn causes diode 19 to conduct. After a short-time t1 to t2, capacitor 9 begins to charge and the negative spike's amplitude exponentially drops to zero, indicating that capacitor 9 is fully charged. When the pulse changes from a negative amplitude to a positive amplitude, voltage across capacitor 9 can change instantly and the entire positive spike applies to the cathode at diode 19. After a short time t2 to t3, capacitor 9 begins to discharge through the resistor 17, +Vaux 10, −Vaux 11 and the secondary coil 7 of transformer 8.

FIGS. 2, 3 and 4 are timing diagrams that plot voltage against time. FIG. 2 plots voltage from the reference of node 1 of FIG. 1, which represents a series of pulses as would be produced from a pulse generator. The plot in FIG. 2 is discrete, either the pulse is at a full positive position or a full negative position. FIG. 3 plots voltage from the reference of node 2, which is located at pulse terminal 13. The differential network of capacitor 9 and resistor 17 produce the sharp spikes that characterize the curve of FIG. 3. When the pulse first turns negative at t1, the voltage is at the full negative position. Almost immediately, the voltage degenerates exponentially until it approaches the limit of zero. Then at t2 the voltage becomes fully positive, followed by an exponential degeneration. FIG. 4 plots voltage from the reference point of node 3. Node 3 is the location of the load of the booster circuit. From t2 to $t_{10}$ the pulses continue to alternate, as shown in FIGS. 1 and 2. But, the output of latching booster circuit 51 remains constant from $t_1$ onwards, and only by interruption of AC source 12 will the voltage supplied to the load drop below Vaux. When the first negative spike occurs a uniform voltage at the full positive position, or +Vaux, is supplied to the load.

When a negative spike is applied to the cathode of diode 19, the diode conducts. Diode 19 is a high speed forward contacting and reverse recovery timing diode. The emitter of driver transistor 26, which is a positively biased transistor, turns on. The collector current passes through resistor 22, resistor 21, transistor 26, diode 19, the secondary coil 7 of transformer 8, to ground thereby developing a turn on voltage across the base-emitter junction of transistor 24. Transistor 24 turns-on and applies +Vaux 10 to the base of transistor 25. Transistor 25 then turns on. By a mutually recursive process transistors 24 and 25 reinforce the on, or closed, state of the other transistor by this positive feedback. This creates a latched circuit. Power from the auxiliary power supply immediately is applied to load 5, which in the preferred embodiment are relay circuits. Thus with only a single pulse, transistors 24 and 25 form a latched power amplifying circuit.

Activating power is limited only by the auxiliary power supply capability and the latching transistor power handling ability. Thus, the booster circuit is not limited by the power of train pulses. The speed of the circuit is limited only by the speed of the latching switches. If the latching switch is a power relay then the speed is relatively slow, but with a solid state relay the speed is relatively fast.

The auxiliary power supply is designed and built to provide enough power to keep latching switches continuously latched. The AC source 12 coupled through capacitor 31 and resistor 32 is rectified by diode 29 and Zener diode 30. Resistor 32 prevents capacitor 31 from peak charging and makes the AC current fully proportional to the AC voltage. Zener diode 30 channels the negative cycle to ground, and the positive cycle is limited to a predetermined peak voltage. The maximum input power ($l_{in}$) is proportional to the value of capacitor 31 in respect to time:

$$l_{in} = C \frac{dv}{dt}$$

To provide sufficient power, up to 150 to 200 milliAmperes of operating current must be supplied. With this constraint, the value of capacitor 31 is approximately 2.2 microFarads ($\mu F$) with a maximum voltage of approximately 250 volts (V). The auxiliary voltage is calculated by:

$$V_{aux} = C \frac{dv}{dt} \times kZ$$

Where kZ is the input impedance between terminals 15 and 16.

In the preferred embodiment, the following components are used:

| Resistor | k$\Omega$ |
| --- | --- |
| 17 | 1.8 |
| 18 | 1.2 |
| 21 | 1.8 |
| 22 | 1.0 |
| 23 | .1 |
| 27 | 10 |
| 32 | .12 |

| Capacitor | FN |
| --- | --- |
| 9 | 330 pF/100 |
| 28 | 220 $\mu$F/16 |
| 31 | 2.2 $\mu$F/250 |

| Transistor | Part No. |
| --- | --- |
| 24 | 2SB561 |
| 25 | 2SD467 |
| 26 | 2SD467 |

| Diode | Part No. |
| --- | --- |
| 19 | RGP10A |
| 29 | IN4606 |
| 30 | 15V zener diode/1w |

Thus, a power booster circuit is described.

I claim:

1. A power boost circuit comprising:
auxiliary power means for supplying power;
a unit comprising a switching means coupled to a load, in parallel with said auxiliary power means;
input means coupled to said switching means for providing an input signal to said switching means.

2. The power boost circuit as recited by claim 1 wherein said switching means comprises of a collector of a first bipolar transistor coupled to a base of a second bipolar transistor.

3. The power boost circuit as recited by claim 2 wherein said switching means further comprises a control circuit for controlling current flow from said amplification means.

4. The power boost circuit as recited by claim 3 wherein said input means comprises a differentiation network coupled to said control circuit and a receiving means coupled to said differentiation network for receiving pulse signals.

5. The power boost circuit as recited by claim 1 wherein said auxiliary power means further comprises alternating current coupling means for coupling to an alternating current source; a rectifier network coupled to said alternating current coupling means; and a capacitor network coupled to said rectifier network.

6. The power boost circuit as recited by claim 4 wherein said alternating current coupling means comprises a resistor and a capacitor.

7. A power boost circuit comprising:
auxiliary power means for supplying power;
switching means coupled to said auxiliary power means for latching power received from said auxiliary power means, said switching means having a control circuit;
differentiation network coupled to said control circuit;
receiving means coupled to said differentiation network for receiving pulse signals.

* * * * *